United States Patent
Yang (10) Patent No.: US 7,678,644 B2
(45) Date of Patent: Mar. 16, 2010

(54) METHOD AND RESULTING STRUCTURE FOR DRAM CELL AND PERIPHERAL TRANSISTOR

(75) Inventor: Hae Wang Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 389 days.

(21) Appl. No.: 11/834,008

(22) Filed: Aug. 6, 2007

(65) Prior Publication Data

US 2008/0138947 A1  Jun. 12, 2008

(30) Foreign Application Priority Data

Dec. 8, 2006   (CN) .................. 2006 1 0119388

(51) Int. Cl.
*H01L 21/8242* (2006.01)
(52) U.S. Cl. ............... 438/241; 257/E21.464; 257/E27.084
(58) Field of Classification Search .......... 257/E27.084, 257/E21.646; 438/241
See application file for complete search history.

(56) References Cited

U.S. PATENT DOCUMENTS 6,472,265 B1 * 10/2002 Hsieh .................. 438/241

* cited by examiner

*Primary Examiner*—Asok K Sarkar
(74) *Attorney, Agent, or Firm*—Townsend and Townsend and Crew LLP (57) ABSTRACT

A method for fabricating DRAM cells, e.g., dynamic random access memory cells. The method includes providing a semiconductor substrate, e.g., silicon wafer. The method includes forming a plurality of NMOS transistor gate structures. Each of the NMOS gate structures includes an NMOS source region and an NMOS drain region and a plurality of PMOS gate structures. Each of the PMOS gate structures includes a PMOS source region and a PMOS drain region. The NMOS gate structures are formed on P-type well regions and the PMOS gate structures are formed on N-type well regions. An interlayer dielectric layer is overlying each of the gate structures while filling a gap between two or more of the NMOS gate structures.

20 Claims, 5 Drawing Sheets

METHOD AND RESULTING STRUCTURE FOR DRAM CELL AND PERIPHERAL TRANSISTOR

CROSS-REFERENCES TO RELATED APPLICATIONS

This application claims priority to Chinese Application No. 200610119388.2; filed on Dec. 8, 2006; (SMIC Ref. No. 1-03-305) commonly assigned, and of which is hereby incorporated by reference for all purposes.

BACKGROUND OF THE INVENTION

The present invention is directed to integrated circuits and their processing for the manufacture of semiconductor devices. More particularly, the invention provides a method and structures for manufacturing dynamic random access memory devices, commonly called DRAMs. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of cell regions for dynamic random access memory devices. Such process includes, among others, those for the memory array in stacked based capacitors and trench based capacitors. Although there have been significant improvements, such designs still have many limitations. As merely an example, these designs must become smaller and smaller but still provide efficient device reliability and operability. Additionally, these conventional cell regions are often difficult to manufacture and generally require complex manufacturing processes and structures. Gap filling between individual transistor gate structures has become difficult with smaller and smaller designs. These and other limitations will be described in further detail throughout the present specification and more particularly below.

From the above, it is seen that an improved technique for processing semiconductor devices is desired.

SUMMARY OF THE INVENTION

According to the present invention, techniques for processing integrated circuits for the manufacture of semiconductor devices are provided. More particularly, the invention provides a method and structures for manufacturing dynamic random access memory devices, commonly called DRAMs. But it would be recognized that the invention has a much broader range of applicability.

In a specific embodiment, the present invention provides a method for fabricating DRAM cells, e.g., dynamic random access memory cells. The method includes providing a semiconductor substrate, e.g., silicon wafer. The method includes forming a plurality of NMOS transistor gate structures, e.g., width of 0.14 microns and less in dimension. Each of the NMOS gate structures includes an NMOS source region and an NMOS drain region and a plurality of PMOS gate structures. Each of the PMOS gate structures includes a PMOS source region and a PMOS drain region. The NMOS gate structures are formed on P-type well regions and the PMOS gate structures are formed on N-type well regions. The method includes forming a blanket nitride layer overlying each of the NMOS gate structures, overlying each of the PMOS gate structures, overlying the PMOS source region and the PMOS drain region for each of the PMOS gate structures, and overlying the NMOS source region and the NMOS drain region for each of the NMOS gate structures. The nitride layer forms sidewall spacers on each of the NMOS gate structures and on each of the PMOS gate structures. The method forms a blanket oxide layer overlying the nitride layer. The blanket oxide layer covers an entirety of the nitride layer. The method removes portions of the oxide layer overlying the nitride layer on the PMOS source region and the PMOS gate region for each of the PMOS gate structures and overlying the nitride layer on the NMOS source region and the NMOS gate region for each of the NMOS gate structures to form oxide spacers on each of the NMOS and PMOS gate structures. The method forms a first protective layer using a first mask structure overlying the NMOS gate structures overlying the P-type well regions. The method implants P type impurities into the PMOS source region and the PMOS drain region associated with each of the PMOS gate structures using at least the oxide spacers on each of the NMOS and PMOS gate structures as blocking structures. The first protective layer overlying the NMOS gate structures is removed. The method forms a second protective layer using a second mask structure overlying the PMOS gate structures, which are on the N-type well regions. The method implants N-type impurities into the NMOS source region and the NMOS drain region into each of the NMOS transistors. The method selectively removes the oxide spacers while exposing the nitride layer to increase a spacing to a predetermined width between two or more of the NMOS gate structures. An interlayer dielectric layer overlying each of the gate structures while filling a gap between two or more of the NMOS gate structures is formed. Preferably, the method performs steam annealing the interlayer dielectric layer to finish the interlayer dielectric layer, which is free from any gaps therein.

In an alternative specific embodiment, the present invention provides a method for fabricating DRAM cells, e.g., dynamic random access memory cells. The method includes providing a semiconductor substrate, e.g., silicon wafer. The method includes forming a plurality of NMOS transistor gate structures. Each of the NMOS gate structures includes an NMOS source region and an NMOS drain region and a plurality of PMOS gate structures. Each of the PMOS gate structures includes a PMOS source region and a PMOS drain region. The NMOS gate structures are formed on P-type well regions and the PMOS gate structures are formed on N-type well regions. The method includes forming a blanket nitride layer overlying each of the NMOS gate structures, overlying each of the PMOS gate structures, overlying the PMOS source region and the PMOS drain region for each of the PMOS gate structures, and overlying the NMOS source region and the NMOS drain region for each of the NMOS gate structures. The nitride layer forms sidewall spacers on each of the NMOS gate structures and on each of the PMOS gate structures. The method forms a blanket oxide layer overlying the nitride layer. The blanket oxide layer covers an entirety of the nitride layer. The method removes portions of the oxide layer overlying the nitride layer on the PMOS source region and the PMOS gate region for each of the PMOS gate structures and overlying the nitride layer on the NMOS source region and the NMOS gate region for each of the NMOS gate structures to form oxide spacers on each of the NMOS and PMOS gate structures. The method forms a first protective layer using a first mask structure overlying the NMOS gate structures overlying the P-type well regions. The method implants P type impurities into the PMOS source region and the PMOS drain region associated with each of the PMOS gate structures using at least the oxide spacers on each of the NMOS and PMOS gate structures as blocking structures. The first protective layer overlying the NMOS gate structures is removed. The method forms a second protective layer using a second mask structure overlying the PMOS gate structures, which are on the N-type well regions. The method implants N-type impurities into the NMOS source region and the NMOS drain region into each of the NMOS transistors. The method selectively removes the oxide spacers while exposing the nitride layer to increase a spacing to a predetermined width between two or more of the NMOS gate structures, An interlayer dielectric layer overlying each of the gate structures while filling a gap between two or more of the NMOS gate structures is formed.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 0.13 microns and less. Additionally, the invention provides improved gap filling characteristics between smaller and smaller transistor spacing. In certain embodiments, the invention provides reduced surface damage in peripheral transistor areas using a buffered source/drain implant. In other embodiments, the method reduces certain photolithography processes based upon the present process flow. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for manufacturing a test structure for dynamic random access memory devices, commonly called DRAMs. But it would be recognized that the invention has a much broader range of applicability.

A method for fabricating a dynamic random access memory device according to an embodiment of the present invention may be outlined as follows:

1. Provide a semiconductor substrate, e.g., silicon wafer, silicon on insulator;

2. Form a plurality of NMOS transistor structures, each of which includes a NMOS gate structure, an NMOS source region and an NMOS drain region;

3. Form a plurality of PMOS transistor structures, each of which includes a PMOS gate structure, PMOS source region and a PMOS drain region;

4. Form a blanket nitride layer overlying each of the NMOS gate structures, overlying each of the PMOS gate structures, overlying the PMOS source region and the PMOS drain region for each of the PMOS gate structures, and overlying the NMOS source region and the NMOS drain region for each of the NMOS gate structures;

5. Form a blanket oxide layer overlying the nitride layer to cover an entirety of the nitride layer;

6. Remove portions of the oxide layer overlying the nitride layer on the PMOS source region and the PMOS gate region for each of the PMOS gate structures and overlying the nitride layer on the NMOS source region and the NMOS gate region for each of the NMOS gate structures to form oxide spacers on each of the NMOS and PMOS gate structures;

7. Forms a first protective layer using a first mask structure overlying the NMOS gate structures overlying P-type well regions;

8. Implant P type impurities into the PMOS source region and the PMOS drain region associated with each of the PMOS gate structures using at least the oxide spacers on each of the NMOS and PMOS gate structures as blocking structures;

9. Remove the first protective layer overlying the NMOS gate structures;

10. Form a second protective layer using a second mask structure overlying the PMOS gate structures, which are on N-type well regions;

11. Implant N-type impurities into the NMOS source region and the NMOS drain region into each of the NMOS transistors;

12. Selectively remove the oxide spacers while exposing the nitride layer to increase a spacing to a predetermined width between two or more of the NMOS gate structures;

13. Form an interlayer dielectric layer (e.g., borophosphosilicate glass (BPSG), high density plasma (HDP) oxide, phosphosilicate glass (PSG), HDP fluorinated silicon glass)

overlying each of the gate structures while filling a gap between two or more of the NMOS gate structures;

14. Optionally, perform steam annealing the interlayer dielectric layer to finish the interlayer dielectric layer, which is free from any gaps therein;

15. Planarize the interlayer dielectric layer; and

16. Perform other steps, as desired.

The above sequence of steps provides a method according to an embodiment of the present invention. As shown, the method uses a combination of steps including a way of fabricating a dynamic random access memory device. Because peripheral transistor spacer etching is stopped on a nitride layer using an end point detection, silicon surface damage can be reduced on the source/drain regions in certain embodiments. Additionally, certain processes (e.g., cell oxide removal) occur without additional photolithography steps for blocking a peripheral area. In a specific embodiment, the invention also provides improved gap filling of the interlayer dielectric layer. Of course, other alternatives can also be provided where steps are added, one or more steps are removed, or one or more steps are provided in a different sequence without departing from the scope of the claims herein. Further details of the present method can be found throughout the present specification and more particularly below.

FIGS. 1 through 5 are simplified diagrams illustrating a method for forming a dynamic random memory device according to an embodiment of the present invention. These diagrams are merely examples that should not unduly limit the scope of the claims herein. One of ordinary skill in the art would recognize many variations, alternatives, and modifications. As shown, the method includes providing a semiconductor substrate, e.g., silicon wafer. The substrate includes a cell or array region 101 and a peripheral region 103. The cell region includes a deep N-well 105 and a P-well 107. The peripheral region includes a P-well 109 and N-well 111. The method includes forming a plurality of NMOS transistor gate structures 115, 125 corresponding respectively to a plurality of NMOS transistors. Each of the NMOS transistors includes an NMOS source region 121 and an NMOS drain region 122. The NMOS gate structures are provided in both peripheral regions and cell regions. Field oxide regions 113 are also included. The field oxide regions are isolations that may be shallow trench isolation and the like. The method also includes forming, concurrently with the NMOS transistor gates, a plurality of PMOS gate structures 123. Each of the plurality of PMOS transistor includes a PMOS source region and a PMOS drain region. Each of the gate structures are formed using a patterned masking layer, which can be photo resist and/or hard mask material followed by an etch process. Each of the gate structures can comprise doped polysilicon material 115 and an overlying cap layer 117. The method includes a blanket implant process 119 using N-type impurities to form a lightly doped drain structure, commonly called LDD. As shown, the NMOS transistor gate structures in the cell region are spaced closely to each other, which leads to certain difficulties in processing with conventional techniques.

Figure 1:
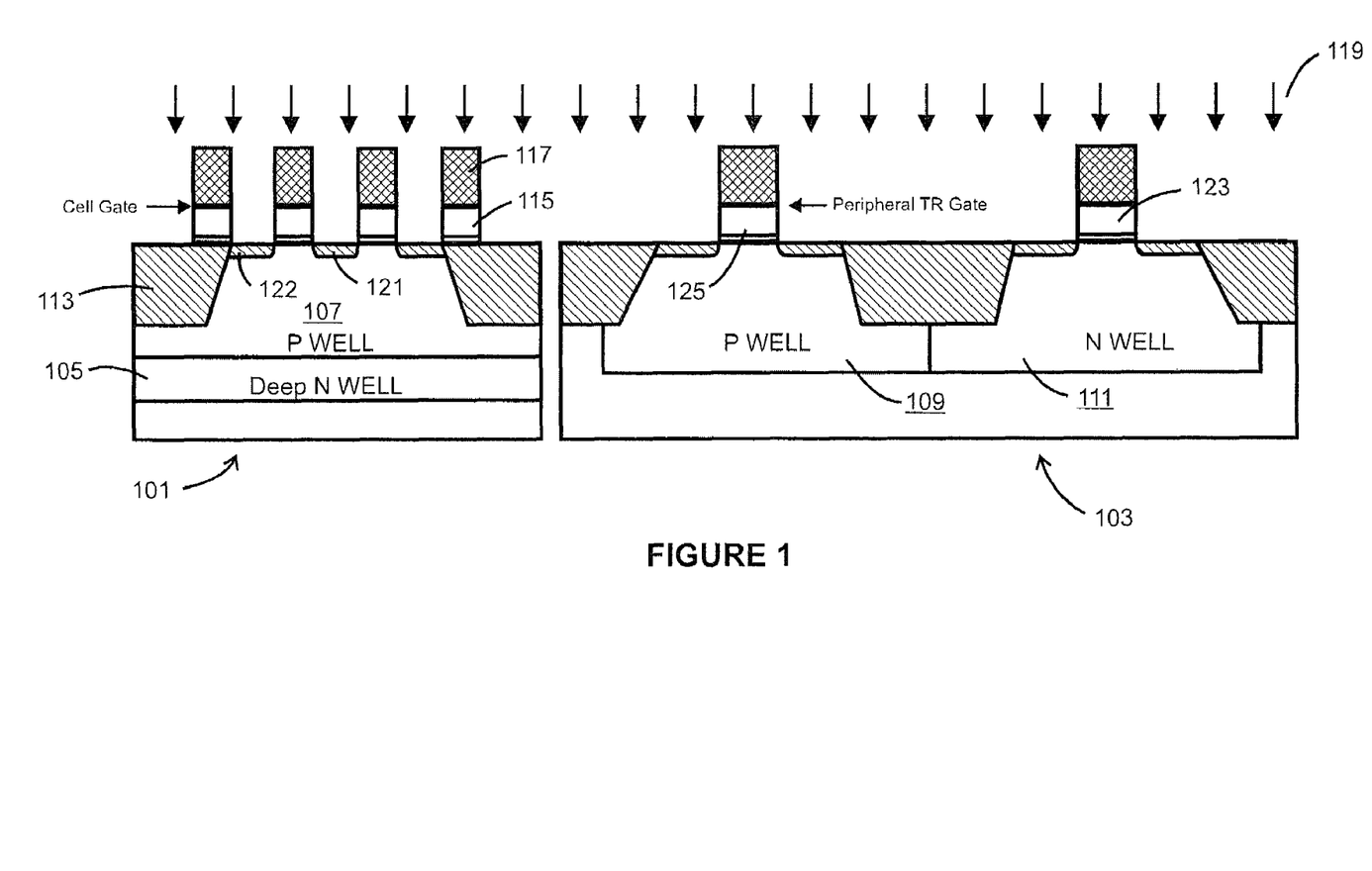
FIGS. 1 through 5 are simplified diagrams illustrating a method for forming a dynamic random memory device according to an embodiment of the present invention.
Figure 2:
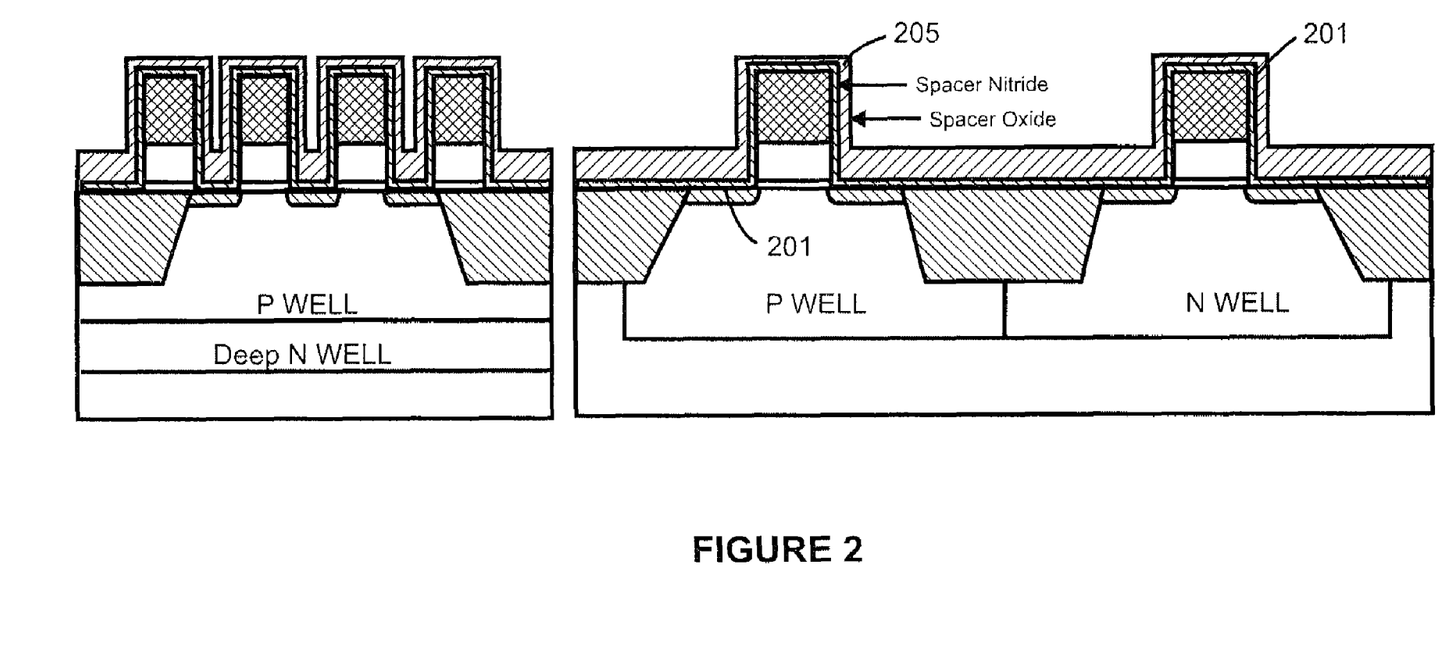

Referring to FIG. 2, the method includes forming a blanket nitride layer 201 overlying each of the NMOS gate structures, overlying each of the PMOS gate structures, overlying the PMOS source region and the PMOS drain region for each of the PMOS transistor structures, and overlying the NMOS source region and the NMOS drain region for each of the NMOS transistor structures. The nitride layer forms sidewall spacers on each of the NMOS gate structures and on each of the PMOS gate structures. In a specific embodiment, the blanket nitride layer has a thickness ranging from about 100 to 200 Angstroms. Preferably, the blanket nitride layer is provided using LPCVD or other suitable techniques. In a preferred embodiment, the blanket nitride layer on the source region and the drain region associated with each of the gate structures prevents surface damage to the source region and the drain region associated with each of the gate structures. Thereafter, the method forms a blanket oxide layer 205 overlying the nitride layer. The blanket oxide layer covers an entirety of the nitride layer. As shown, the spacing between each of the NMOS transistor structures in the cell region is less than about 70 nanometers, which leads to gap filling problems using conventional techniques.

Figure 3:
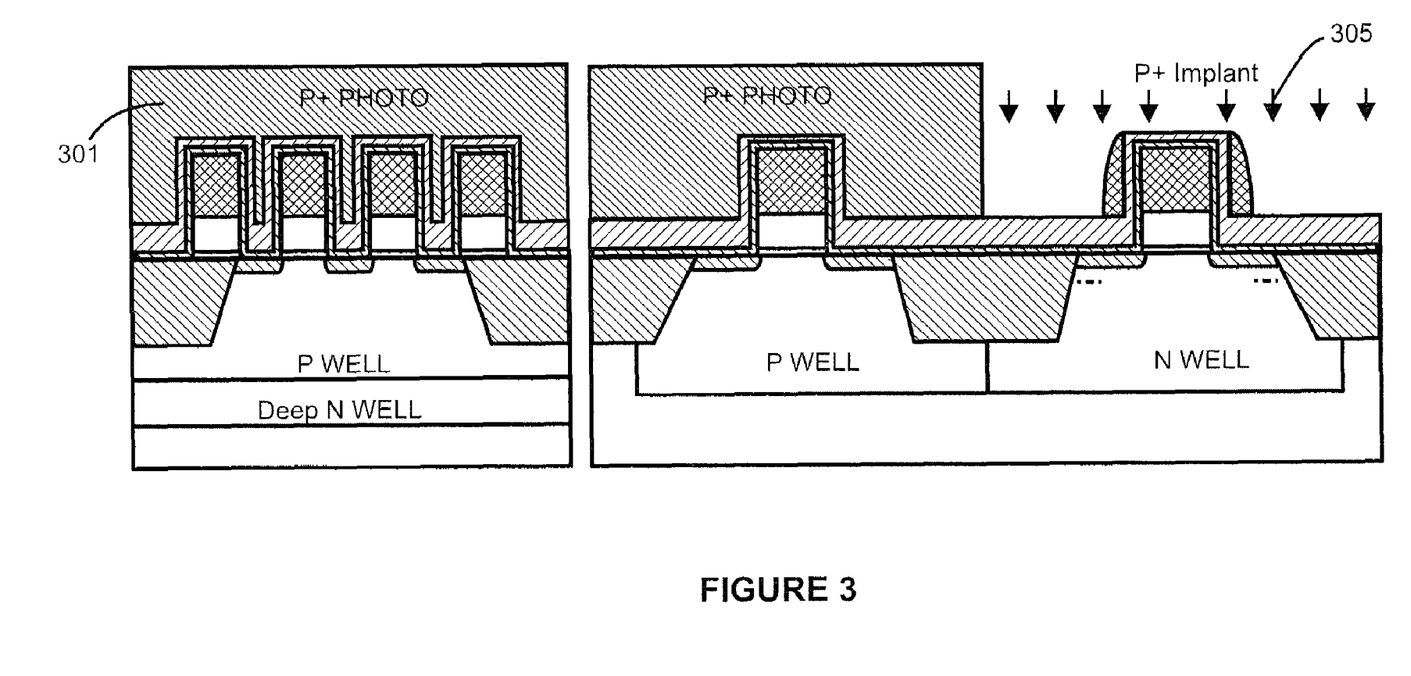

While protecting the cell region and the NMOS region in the peripheral region using a protective layer, the method removes portions of the oxide layer overlying the nitride layer on the PMOS source region and the PMOS gate region for each of the PMOS gate structures in the peripheral region, as illustrated by FIG. 3. In a specific embodiment, the portions of the oxide layer can be removed using an anisotropic etching process to form oxide spacers. A protective layer 301, including photo masking, had been provided overlying the NMOS gate structures in the cell region and the NMOS gate structures in the peripheral region. The method then implants using ion implantation 305 of P+ type impurities source/drain regions of the PMOS transistors. In a specific embodiment, the P-type impurities include a boron bearing species (e.g., $BF_2$) provided at an energy of about 25 KeV. Preferably, the implanted impurities go through the nitride layer, which remains intact overlying source/drain regions of the PMOS transistor in the peripheral region. The sidewall spacers act as a stop or masking layer for the implantation process. The protective layer is stripped after the implantation process.

Figure 4:
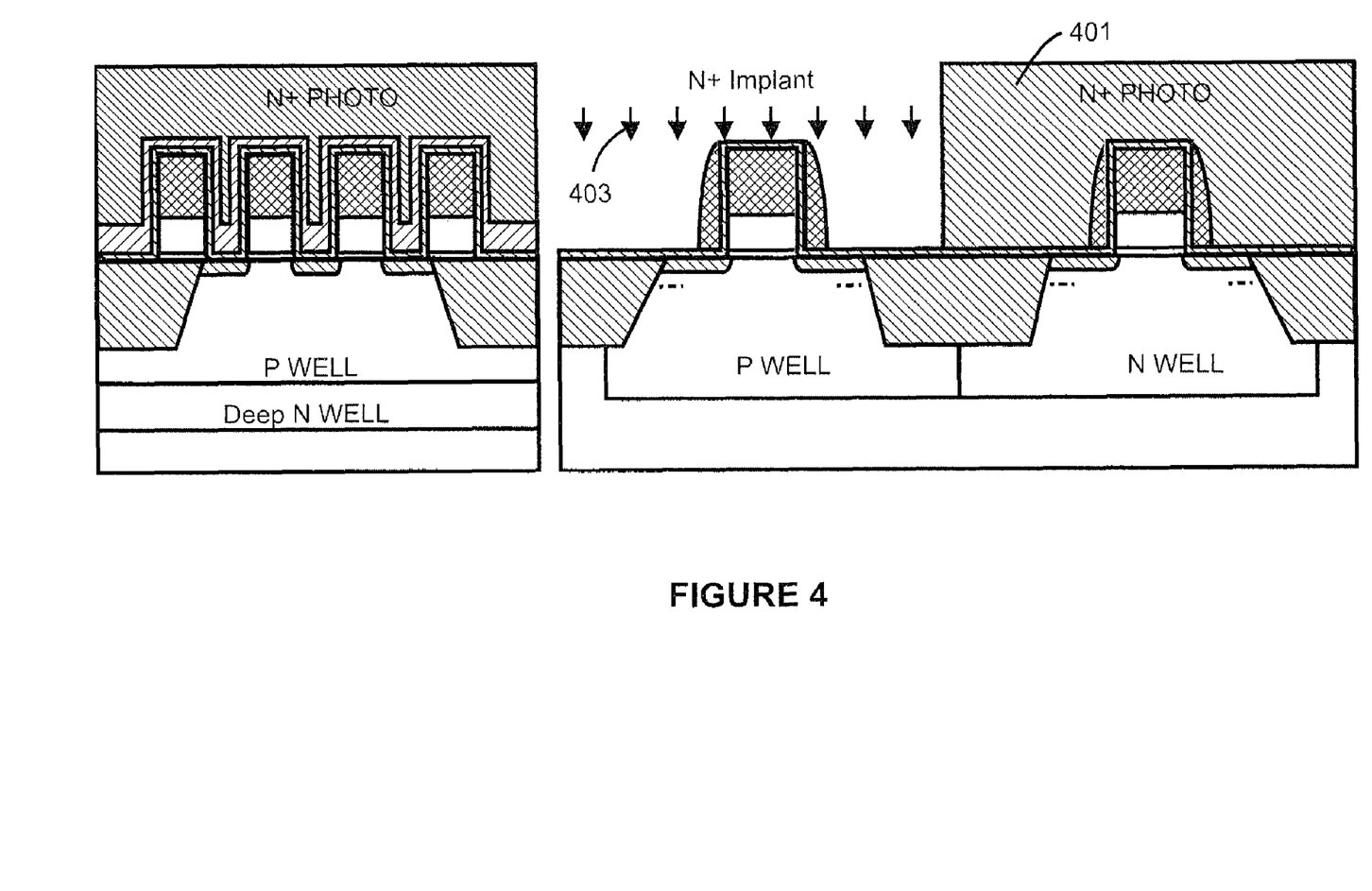

Again while protecting the cell region, the method also removes a portion of the oxide layer overlying the nitride layer on the NMOS source region and the NMOS gate region for each of the NMOS transistor structures in the peripheral region to form oxide spacers on each of the NMOS gate structures, as illustrated by FIG. 4. As shown, the method formed a protective layer 401, including photo masking, overlying the NMOS gate structures in the cell region and PMOS gate structures in the peripheral region. In a specific embodiment, the method implants 403 N-type impurities into the NMOS source region and the NMOS drain region into each of the NMOS transistors in the peripheral region. In a specific embodiment, the implantation of N-type impurities uses arsenic bearing species at an energy of about 30 KeV. Preferably, the implant impurity goes through the nitride layer, which remains intact over source/drain regions. As shown, the peripheral transistors are processed separately from the cell transistors to optimize the peripheral transistors independently from the cell transistors according to a specific embodiment. The protective layer is stripped after the implantation process.

Figure 5:
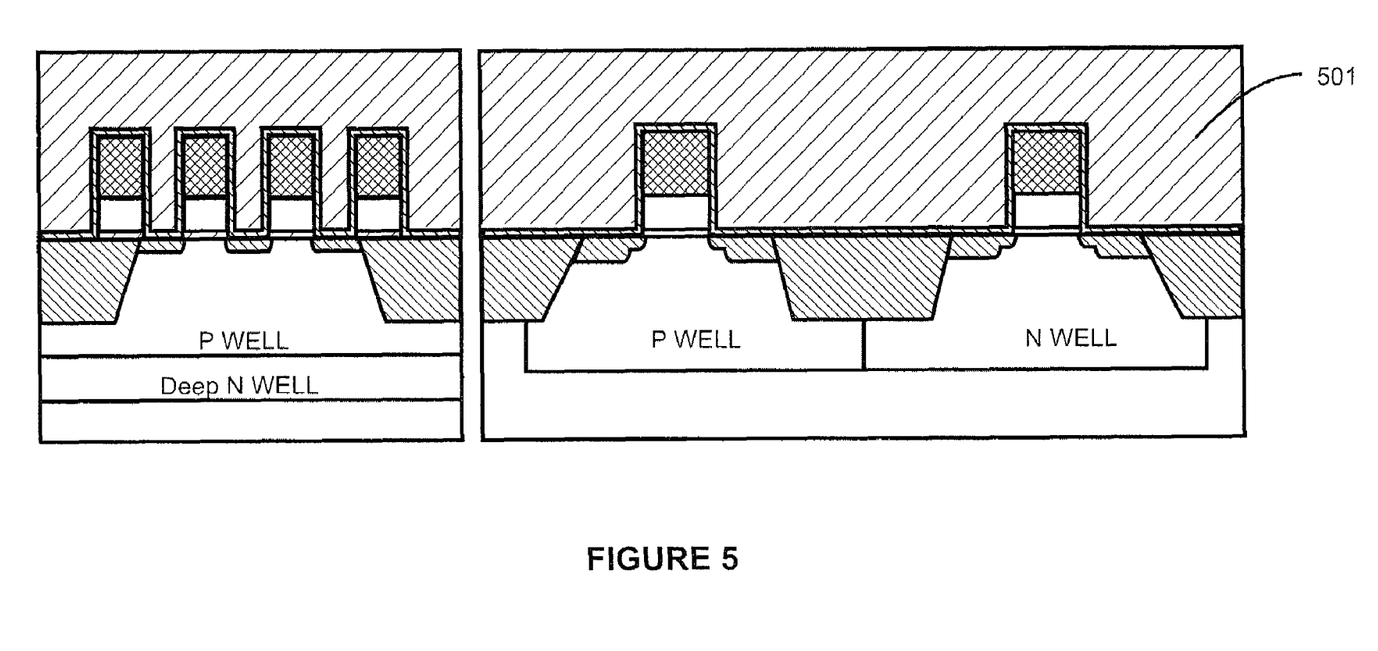

The method selectively removes the oxide spacers while exposing the nitride layer to increase a spacing to a predetermined width between two or more of the NMOS gate structures in the cell regions, as illustrated by FIG. 5. As shown, the nitride layer remains intact. Preferably, the predetermined width is 0.13 microns and greater, but can be others, depends upon the embodiment. That is, the predetermined width is wide and allows for deposition of an interlayer dielectric layer 501. The interlayer dielectric layer overlies each of the gate structures while filling a gap between two or more of the NMOS gate structures. Preferably, the method performs steam annealing the interlayer dielectric layer to finish the interlayer dielectric layer, which is free from any gaps therein. By removing the oxide spacers, an increased width between each of the gate structures provides gap filling qualities in the interlayer dielectric layer. Preferably, the interlayer dielectric material comprises BPSG or other suitable material. Additionally, the steam annealing comprises a $H_2O$ bearing species performed at a temperature greater than about 800 Degrees Celsius or comprises a $H_2O$ bearing species performed at a temperature greater than about 800 Degrees Celsius and less than about 900 Degrees Celsius. Other interlayer dielectric materials, for example, silicon oxide deposited using high density plasma chemical vapor deposition (HDP CVD) may also be used, depending on the embodiment. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating DRAM cells, the method comprising:

providing a semiconductor substrate;

forming a plurality of NMOS transistor gate structures, each of the NMOS gate structures including an NMOS source region and an NMOS drain region and a plurality of PMOS gate structures, each of the PMOS gate structures including a PMOS source region and a PMOS drain region, the NMOS gate structures being formed on P-type well regions and the PMOS gate structures being formed on N-type well regions;

forming a blanket nitride layer overlying each of the NMOS gate structures, overlying each of the PMOS gate structures, overlying the PMOS source region and the PMOS drain region for each of the PMOS gate structures, and overlying the NMOS source region and the NMOS drain region for each of the NMOS gate structures, the nitride layer forming sidewall spacers on each of the NMOS gate structures and on each of the PMOS gate structures;

forming a blanket oxide layer overlying the nitride layer, the blanket oxide layer covering an entirety of the nitride layer;

removing portions of the oxide layer overlying the nitride layer on the PMOS source region and the PMOS gate region for each of the PMOS gate structures and overlying the nitride layer on the NMOS source region and the NMOS gate region for each of the NMOS gate structures to form oxide spacers on each of the NMOS and PMOS gate structures;

forming a first protective layer using a first mask structure overlying the NMOS gate structures overlying the P-type well regions;

implanting P type impurities into the PMOS source region and the PMOS drain region associated with each of the PMOS gate structures using at least the oxide spacers on each of the NMOS and PMOS gate structures as blocking structures;

removing the first protective layer overlying the NMOS gate structures;

forming a second protective layer using a second mask structure overlying the PMOS gate structures, the PMOS gate structures on the N-type well regions;

implanting N-type impurities into the NMOS source region and the NMOS drain region into each of the NMOS transistors;

selectively removing the oxide spacers while exposing the nitride layer to increase a spacing to a predetermined width between two or more of the NMOS gate structures;

forming an interlayer dielectric layer overlying each of the gate structures while filling a gap between two or more of the NMOS gate structures; and steam annealing the interlayer dielectric layer to finish the interlayer dielectric layer, the interlayer dielectric layer being free from any gaps therein.

2. The method of claim 1 wherein the predetermined width is no greater than 0.13 microns there between.

3. The method of claim 1 wherein each of the NMOS gate structures has a width of 0.14 microns and less.

4. The method of claim 1 wherein the increased width provides gap filling qualities in the interlayer dielectric layer.

5. The method of claim 1 wherein the interlayer dielectric material comprises BPSG.

6. The method of claim 1 wherein the steam annealing comprises a $H_2O$ bearing species at a temperature greater than about 800 Degrees Celsius.

7. The method of claim 1 wherein the steam annealing comprises a $H_2O$ bearing species at a temperature greater than about 800 Degrees Celsius and less than about 900 Degrees Celsius.

8. The method of claim 1 wherein the blanket nitride layer on the NMOS source region and the NMOS drain region associated with each of the NMOS gate structures prevents surface damage to the NMOS source region and the NMOS drain region associated with each of the NMOS gate structures.

9. The method of claim 1 wherein the steam annealing on at least the interlayer dielectric layer reflows the interlayer dielectric layer to degas the interlayer dielectric layer.

10. The method of claim 1 wherein the blanket nitride layer has a thickness ranging from about 100 to 200 Angstroms.

11. The method of claim 1 wherein the blanket nitride layer is provided using LPCVD.

12. The method of claim 1 wherein the implanting N-type impurities uses arsenic bearing species at an energy of about 30 KeV.

13. The method of claim 1 wherein the implanting P-type impurities uses a boron bearing species ($BF_2$) at an energy of about 25 KeV.

14. The method of claim 1 wherein NMOS gate structures include one or more NMOS gate structures in a cell array region and one or more NMOS gate structures in a peripheral region.

15. A method for fabricating DRAM cells, the method comprising:

providing a semiconductor substrate;

forming a plurality of NMOS transistor gate structures, each of the NMOS gate structures including an NMOS source region and an NMOS drain region and a plurality of PMOS gate structures, each of the PMOS gate structures including a PMOS source region and a PMOS drain region, the NMOS gate structures being formed on P-type well regions and the PMOS gate structures being formed on N-type well regions;

forming a blanket nitride layer overlying each of the NMOS gate structures, overlying each of the PMOS gate structures, overlying the PMOS source region and the PMOS drain region for each of the PMOS gate structures, and overlying the NMOS source region and the NMOS drain region for each of the NMOS gate structures, the nitride layer forming sidewall spacers on each of the NMOS gate structures and on each of the PMOS gate structures;

forming a blanket oxide layer overlying the nitride layer, the blanket oxide layer covering an entirety of the nitride layer;

removing portions of the oxide layer overlying the nitride layer on the PMOS source region and the PMOS gate region for each of the PMOS gate structures and overlying the nitride layer on the NMOS source region and the NMOS gate region for each of the NMOS gate structures to form oxide spacers on each of the NMOS and PMOS gate structures;

forming a first protective layer using a first mask structure overlying the NMOS gate structures overlying the P-type well regions;

implanting P type impurities into the PMOS source region and the PMOS drain region associated with each of the PMOS gate structures using at least the oxide spacers on each of the NMOS and PMOS gate structures as blocking structures;

removing the first protective layer overlying the NMOS gate structures;

forming a second protective layer using a second mask structure overlying the PMOS gate structures, the PMOS gate structures on the N-type well regions;

implanting N-type impurities into the NMOS source region and the NMOS drain region into each of the NMOS transistors;

selectively removing the oxide spacers while exposing the nitride layer to increase a spacing to a predetermined width of no greater than 0.13 microns between two or more of the NMOS gate structures; and forming an interlayer dielectric layer comprising a doped oxide overlying each of the gate structures while filling a gap between two or more of the NMOS gate structures.

16. The method of claim 15 further comprising steam annealing the interlayer dielectric layer to finish the interlayer dielectric layer, the interlayer dielectric layer being free from any gaps therein.

17. The method of claim 15 wherein each of the NMOS gate structures has a width of 0.14 microns and less.

18. The method of claim 15 wherein the increased width provides gap filling qualities in the interlayer dielectric layer.

19. The method of claim 15 wherein the interlayer dielectric material comprises BPSG.

20. The method of claim 15 wherein the steam annealing comprises a $H_2O$ bearing species at a temperature greater than about 800 Degrees Celsius.

* * * * *